(12) United States Patent
Yaita et al.

(10) Patent No.: US 11,791,384 B2
(45) Date of Patent: Oct. 17, 2023

(54) SEMICONDUCTOR DEVICE

(71) Applicant: FUJITSU LIMITED, Kawasaki (JP)

(72) Inventors: Junya Yaita, Atsugi (JP); Junji Kotani, Atsugi (JP); Atsushi Yamada, Hiratsuka (JP); Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 252 days.

(21) Appl. No.: 17/209,869

(22) Filed: Mar. 23, 2021

(65) Prior Publication Data

US 2022/0013642 A1 Jan. 13, 2022

(30) Foreign Application Priority Data

Jul. 13, 2020 (JP) ................................ 2020-119964

(51) Int. Cl.
| | |
|---|---|
| *H01L 29/20* | (2006.01) |
| *H01L 29/10* | (2006.01) |
| *H01L 29/78* | (2006.01) |
| *H01L 29/205* | (2006.01) |

(52) U.S. Cl.
CPC ...... *H01L 29/2003* (2013.01); *H01L 29/1029* (2013.01); *H01L 29/205* (2013.01); *H01L 29/7842* (2013.01)

(58) Field of Classification Search
None
See application file for complete search history.

(56) References Cited

U.S. PATENT DOCUMENTS

| | | | | |
|---|---|---|---|---|
| 9,233,844 | B2* | 1/2016 | Chen | ................ B82Y 10/00 |
| 2009/0045438 | A1 | 2/2009 | Inoue et al. | |
| 2010/0320505 | A1* | 12/2010 | Okamoto | .......... H01L 29/41766 438/168 |
| 2014/0001439 | A1* | 1/2014 | Chen | ................ H01L 21/02381 257/E29.091 |
| 2014/0091313 | A1* | 4/2014 | Kotani | ............... H01L 21/0262 257/76 |
| 2015/0076509 | A1* | 3/2015 | Ishiguro | ............. H01L 21/0262 438/172 |
| 2015/0340230 | A1* | 11/2015 | Ikuta | ................. C23C 16/45531 438/478 |

(Continued)

FOREIGN PATENT DOCUMENTS

| | | |
|---|---|---|
| JP | 2019-033122 A | 2/2019 |
| WO | WO 2007-077666 A1 | 7/2007 |

*Primary Examiner* — Khaja Ahmad
(74) *Attorney, Agent, or Firm* — ArentFox Schiff LLP (57) ABSTRACT

A semiconductor device includes an underlayer made of a first nitride semiconductor, a first buffer layer made of a second nitride semiconductor, provided on the underlayer, and subjected to compressive stress from the underlayer in an in-plane direction which is perpendicular to a thickness direction of the underlayer, a second buffer layer made of a third nitride semiconductor, provided on the first buffer layer, and subjected to compressive stress from the first buffer layer in the in-plane direction, a channel layer made of a fourth nitride semiconductor, provided on the second buffer layer, and subjected to compressive stress from the second buffer layer in the in-plane direction, and a barrier layer made of a fifth nitride semiconductor, and provided above the channel layer.

8 Claims, 10 Drawing Sheets

(56) References Cited

U.S. PATENT DOCUMENTS

2016/0064488 A1\* 3/2016 Takado ................. H01L 29/205
257/20
2019/0043976 A1 2/2019 Kotani et al.

\* cited by examiner

SEMICONDUCTOR DEVICE

CROSS-REFERENCE TO RELATED APPLICATIONS

This application is based upon and claims the benefit of priority of the prior Japanese Patent Application No. 2020-119964, filed on Jul. 13, 2020, the entire contents of which are incorporated herein by reference.

FIELD

The embodiments discussed herein are related to semiconductor devices.

BACKGROUND

Nitride semiconductors have properties, such as a high saturated electron velocity, a wide band gap, or the like. For this reason, various studies have been conducted to apply the nitride semiconductors to high-voltage, high-power semiconductor devices by utilizing these properties. For example, the band gap of GaN, which is a type of nitride semiconductor, is 3.4 eV. This band gap of GaN is higher than the band gap of Si, which is 1.1 eV, and higher than the band gap of GaAs, which is 1.4 eV. Hence, GaN has a high breakdown field strength, and is a very promising material for use in the semiconductor devices for power supplies, designed to perform a high-voltage operation and obtain a high power output.

Examples of the semiconductor device using the nitride semiconductor include field effect transistors (FETs), and particularly high electron mobility transistors (HEMTs), which may be found in numerous reports. For example, in GaN-based HEMTs, an AlGaN/GaN-HEMl, using a GaN channel layer and an AlGaN barrier layer, has attracted attention.

In order to improve the mobility, transistors having a quantum confined structure, using a large band offset between AlN and GaN, have also been proposed.

An example of a compound semiconductor is proposed in Japanese Laid-Open Patent Publication No. 2019-033122, for example. Further, an example of a nitride FET is proposed in International Publication Pamphlet No. WO 2007/077666, for example.

However, according to the conventional transistors having the quantum confined structure, it is difficult to reduce the sheet resistance.

SUMMARY

Accordingly, it is an object in one aspect of the embodiments to provide a semiconductor device which can reduce the sheet resistance.

According to one aspect of the embodiments, a semiconductor device includes an underlayer made of a first nitride semiconductor; a first buffer layer made of a second nitride semiconductor, provided on the underlayer, and subjected to compressive stress from the underlayer in an in-plane direction which is perpendicular to a thickness direction of the underlayer; a second buffer layer made of a third nitride semiconductor, provided on the first buffer layer, and subjected to compressive stress from the first buffer layer in the in-plane direction; a channel layer made of a fourth nitride semiconductor, provided on the second buffer layer, and subjected to compressive stress from the second buffer layer in the in-plane direction; and a barrier layer made of a fifth nitride semiconductor, and provided above the channel layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of a semiconductor device according to each embodiment of the present invention.

[Outline of Transistor Having Quantum Confined Structure]

Figure 1:
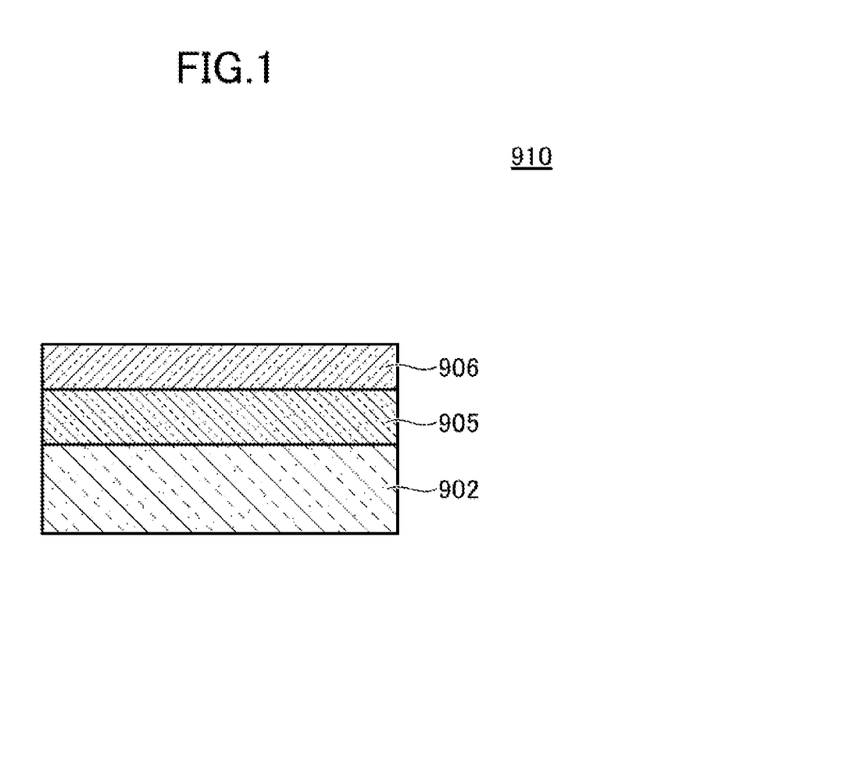
FIG. 1 is a cross sectional view illustrating a portion of a semiconductor device according to a first reference example.

First, an outline of a transistor having a quantum confined structure will be described. FIG. 1 is a cross sectional view illustrating a portion of a semiconductor device according to a first reference example including the transistor having the quantum confined structure.

Figure 2:
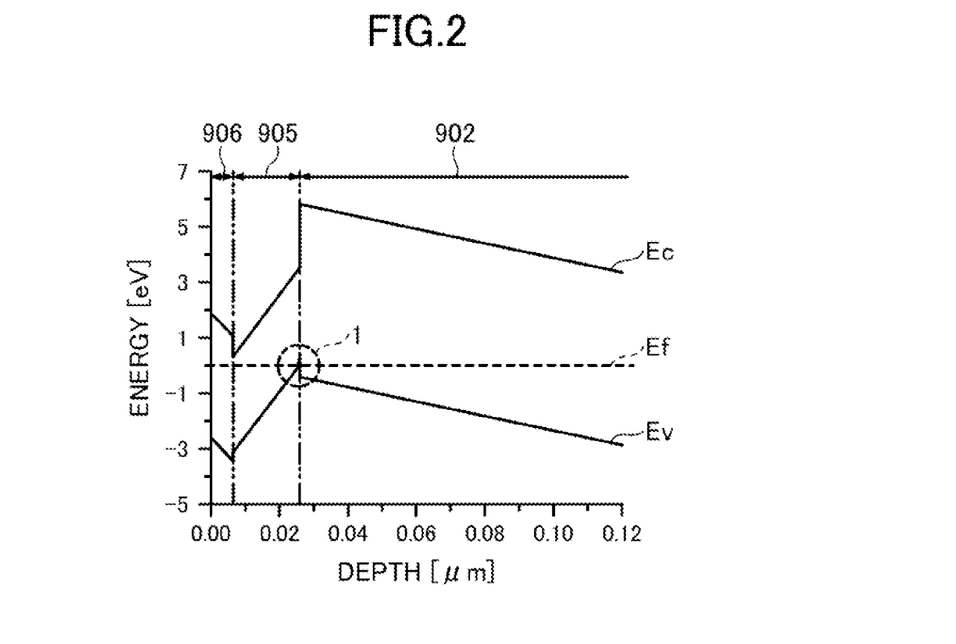
FIG. 2 is a diagram illustrating a band structure of the semiconductor device according to the first reference example.

In a semiconductor device 910 according to the first reference example, a buffer layer 902 made of AlN, a channel layer 905 made of GaN, and a barrier layer 906 made of $Al_{0.5}Ga_{0.5}N$ are formed in this order on an AlN substrate (not illustrated), as illustrated in FIG. 1. Source, gate, and drain electrodes (not illustrated) are formed on the barrier layer 906. The channel layer 905 has a thickness of 50 nm or less. FIG. 2 illustrates a band structure of the semiconductor device 910 according to the first reference example. In FIG. 2, Ef denotes a Fermi level, Ec denotes a lower end of a conduction band, and Ev denotes an upper end of a valence band.

As indicated by a dashed circle 1 in FIG. 2, in the first reference example, the valence band overlaps the Fermi level Ef near an interface of the channel layer 905 with the buffer layer 902. Hence, holes are generated near the interface of the channel layer 905 with the buffer layer 902, because a strong electric field is applied to the GaN channel layer 905 due to a strong polarization charge of the AlN buffer layer 902. The presence of such holes increases the sheet resistance. For this reason, the interaction between the electrons and the holes decreases the electron mobility and saturation velocity. Furthermore, a depletion layer is not formed even when a negative voltage is applied to the gate electrode, and leak current may easily occur.

Figure 3:
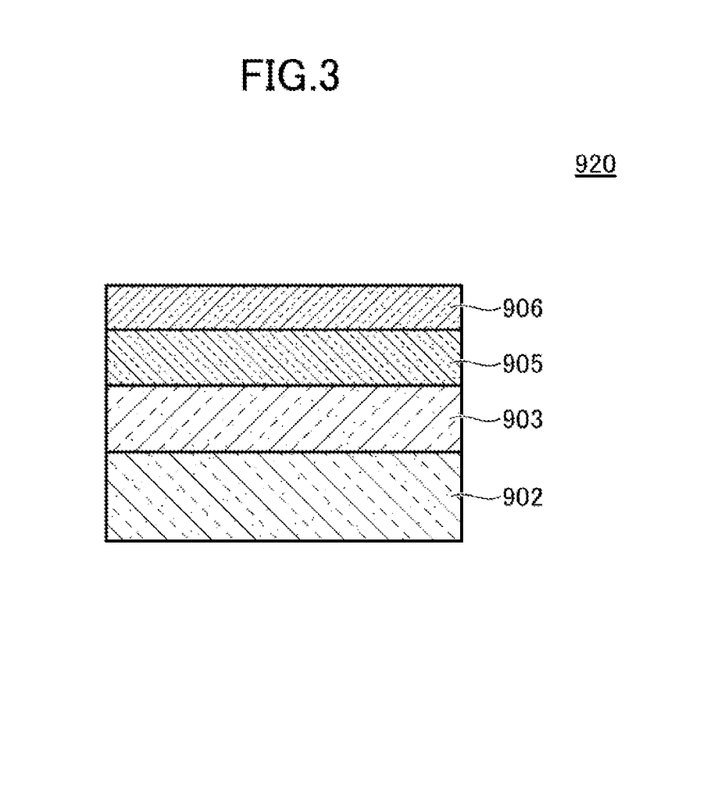
FIG. 3 is a cross sectional view illustrating a portion of the semiconductor device according to a second reference example.

The electric field applied to the channel layer 905 can be relaxed by providing an $Al_{0.86}Ga_{0.14}N$ buffer layer having a high ratio of Al in the AlGaN composition, between the AlN buffer layer 902 and the GaN channel layer 905. FIG. 3 is a cross sectional view illustrating a portion of the semiconductor device according to a second reference example including the transistor having the quantum confined structure.

Figure 4:
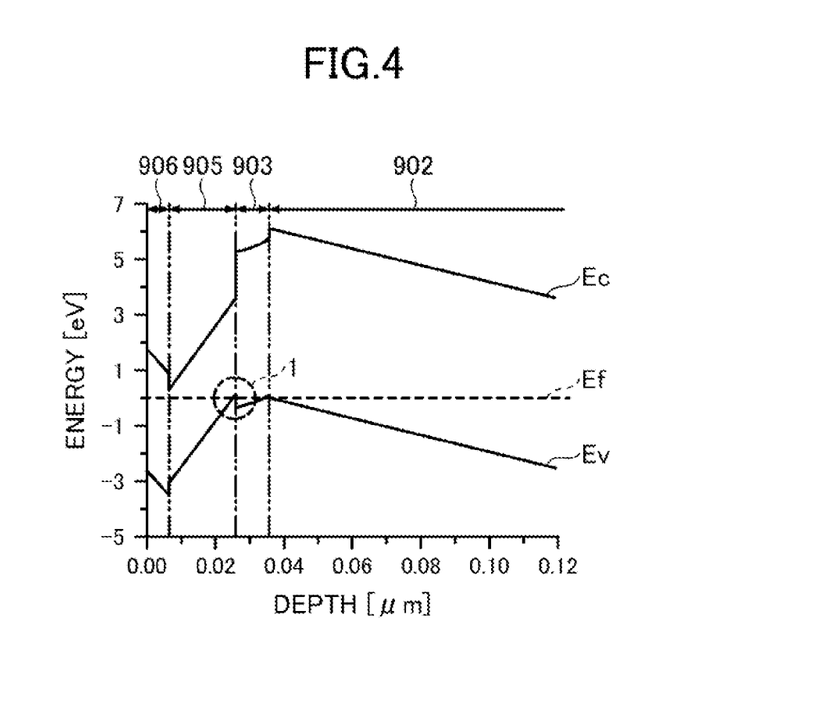
FIG. 4 is a diagram illustrating the band structure of the semiconductor device according to the second reference example.

In a semiconductor device 920 according to the second reference example, a buffer layer 903 made of $Al_{0.86}Ga_{0.14}N$ is provided between the buffer layer 902 made of AlN and the channel layer 905 made of GaN, as illustrated in FIG. 3. Otherwise, the structure of the second reference example is the same as that of the first reference example. FIG. 4 illustrates the band structure of the semiconductor device 920 according to the second reference example.

As illustrated in FIG. 4, in the second reference example, the electric field applied to the channel layer 905 is relaxed compared to the first reference example. However, even when the electric field is relaxed, the valence band overlaps the Fermi level Ef, and the holes are generated near the interface of the channel layer 905 with the buffer layer 902, as indicated by the dashed circle 1.

Figure 5:
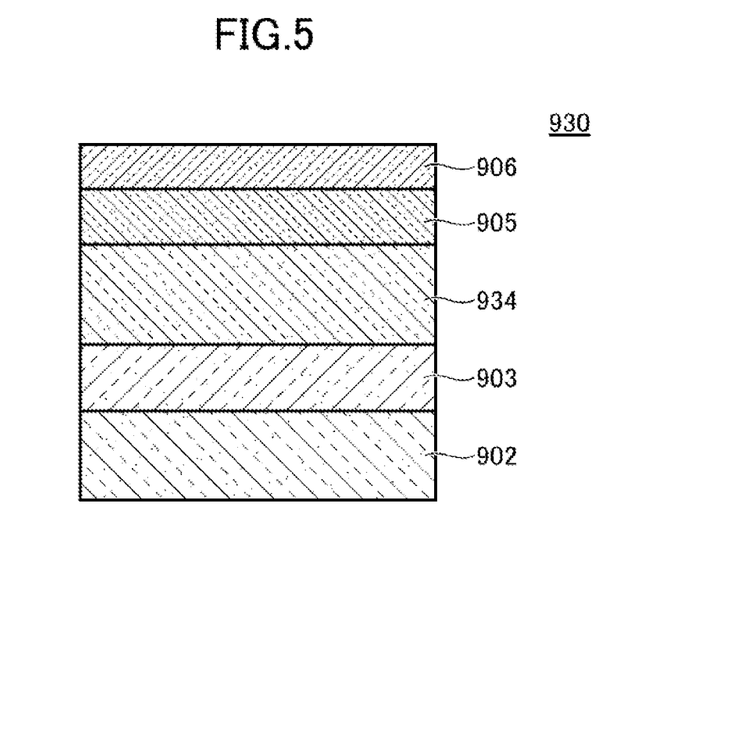
FIG. 5 is a cross sectional view illustrating a portion of the semiconductor device according to a third reference example.

The electric field applied to the channel layer 905 can further be relaxed by providing an $Al_{0.30}Ga_{0.70}N$ buffer layer having a low ratio of Al in the AlGaN composition, between the $Al_{0.86}Ga_{0.14}N$ buffer layer 903 and the GaN channel layer 905. FIG. 5 is a cross sectional view illustrating a portion of the semiconductor device according to a third reference example including the transistor having the quantum confined structure.

Figure 6:
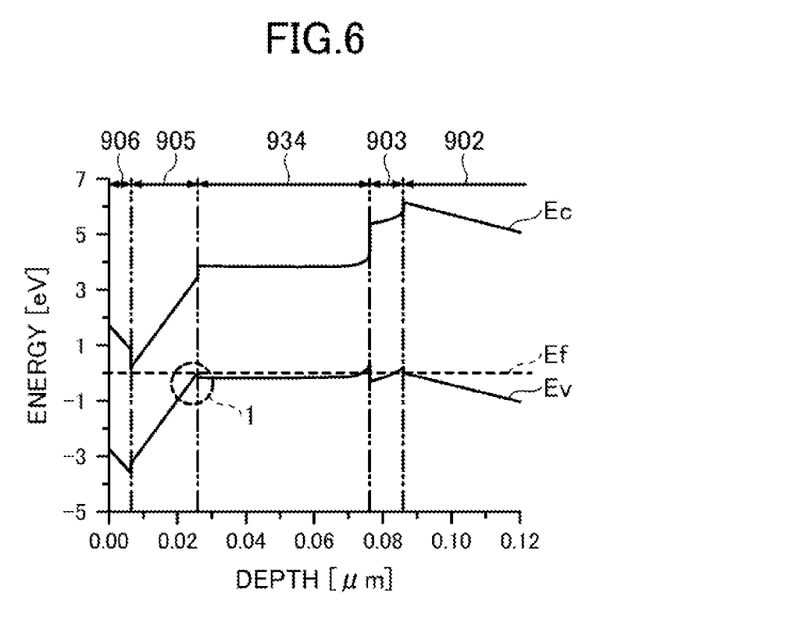
FIG. 6 is a diagram illustrating the band structure of the semiconductor device according to the third reference example.

In a semiconductor device 930 according to the third reference example, an $Al_{0.30}Ga_{0.70}N$ buffer layer 934 of is provided between the $Al_{0.86}Ga_{0.14}N$ buffer layer 903 and the GaN channel layer 905, as illustrated in FIG. 5. The buffer layer 934 is not lattice matched to the buffer layer 903, and stress from the buffer layer 903 is not applied to the buffer layer 934. Otherwise, the structure of the third reference example is the same as that of the second reference example. FIG. 6 illustrates the band structure of the semiconductor device 930 according to the third reference example.

As illustrated in FIG. 6, in the third reference example, the electric field applied to the channel layer 905 is relaxed compared to the second reference example. However, the spontaneous polarization of the GaN forming the channel layer 905 generates an internal electric field, and the holes are generated as indicated by the dashed circle 1.

Figure 7:
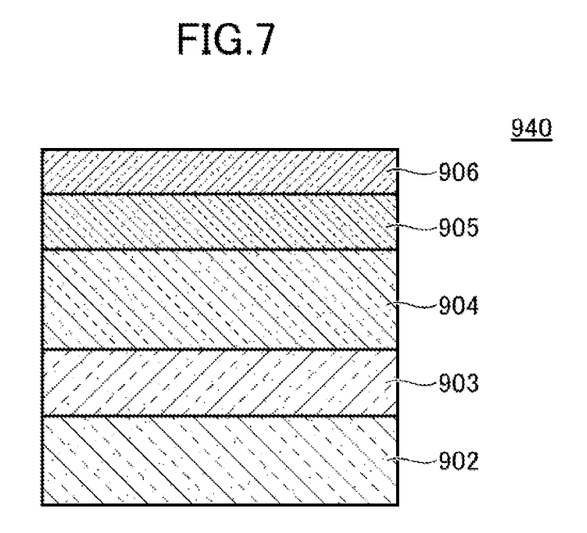
FIG. 7 is a cross sectional view illustrating a portion of the semiconductor device according to a fourth reference example.

The spontaneous polarization of the GaN can be reduced by piezo polarization, by using, in place of buffer layer 934, an $Al_{0.30}Ga_{0.70}N$ buffer layer that is lattice matched to the buffer layer 903 and is subjected to compressive stress from buffer layer 903 in an in-plane direction. FIG. 7 is a cross sectional view illustrating a portion of the semiconductor device according to a fourth reference example including the transistor having the quantum confined structure.

Figure 8:
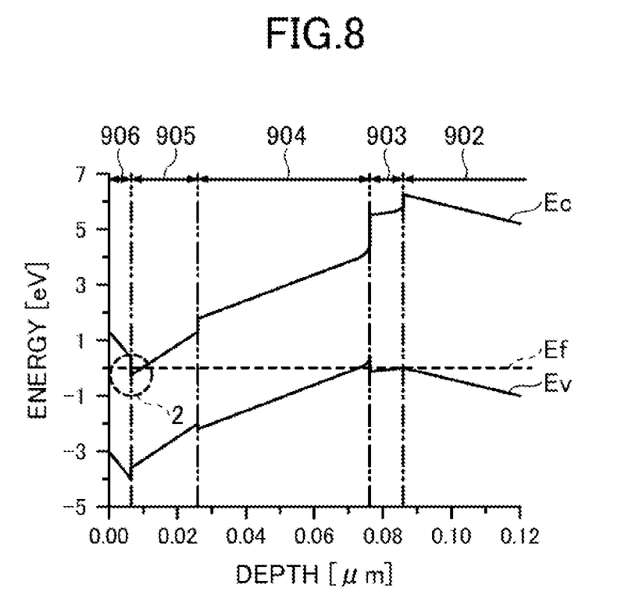
FIG. 8 is a diagram illustrating the band structure of the semiconductor device according to the fourth reference example.

In a semiconductor device 940 according to the fourth reference example, an $Al_{0.30}Ga_{0.70}N$ buffer layer 904 is provided in place of the buffer layer 934, as illustrated in FIG. 7. The $Al_{0.30}Ga_{0.70}N$ buffer layer 904 is lattice matched to the buffer layer 903, and is subjected to the compressive stress from the buffer layer 903 in the in-plane direction. Other configurations are the same as in the third reference example. FIG. 8 illustrates the band structure of the semiconductor device 940 according to the fourth reference example.

As illustrated in FIG. 8, according to the fourth reference example, the generation of holes near the interface of the channel layer 905 with respect to the buffer layer 902 can be reduced. In addition, the conduction band overlaps the Fermi level Ef near the interface of the channel layer 905 with respect to the barrier layer 906, as indicated by a dashed circle 2 in FIG. 8. For this reason, electrons are generated near the interface of the channel layer 905 with respect to the barrier layer 906. In other words, two-dimensional electron gas (2DEG) is generated.

Based on these findings, the present inventors conceived the following embodiments. Hereinafter, embodiments of the present disclosure will be described in detail, with reference to the accompanying drawings. In this specification and the drawings, constituent elements having substantially the same functional structures are designated by the same reference numerals, and a repeated description of the same or substantially the same constituent elements may be omitted.

First Embodiment

Figure 9:
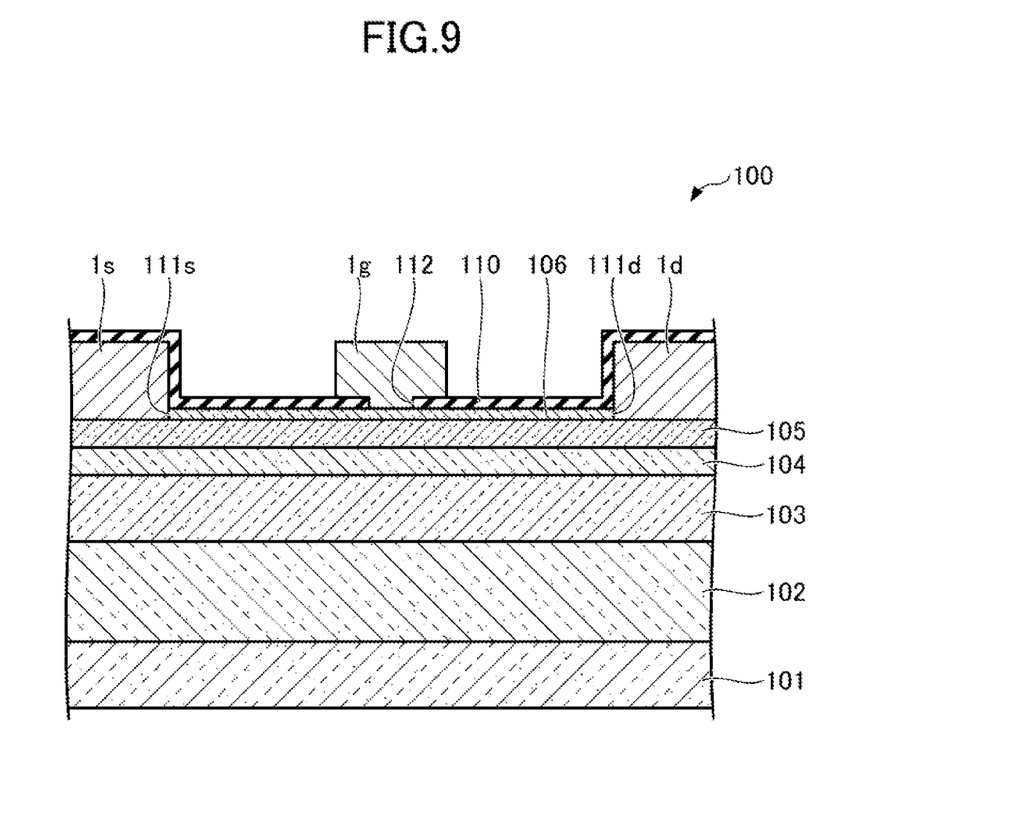
FIG. 9 is a cross sectional view illustrating the semiconductor device according to a first embodiment.

A first embodiment will be described. The first embodiment relates to a semiconductor device including a high electron mobility transistor (HEMT) having the quantum confined structure. FIG. 9 is a cross sectional view illustrating the semiconductor device according to the first embodiment.

In a semiconductor device 100 according to the first embodiment, a nitride semiconductor laminated structure 130 is formed above a substrate 101, as illustrated in FIG. 9. The nitride semiconductor laminated structure 130 includes a buffer layer 102, a buffer layer 103, a buffer layer 104, a channel layer 105, and a barrier layer 106. The buffer layer 102 is formed on the substrate 101. The buffer layer 103 is formed on the buffer layer 102. The buffer layer 104 is formed on the buffer layer 103. The channel layer 105 is formed on the buffer layer 104. The barrier layer 106 is formed on the channel layer 105.

The substrate 101 is an AlN free-standing substrate, for example, and an upper surface of the substrate 101 is an Al-polar surface. In other words, a Miller index of the upper surface of the substrate 101 is (0001). The buffer layer 102 is an AlN layer having a thickness in a range of 50 nm to 150 nm, for example. The buffer layer 103 is an $Al_{x1}Ga_{1-x1}N$ layer having a thickness in a range of 5 nm to 20 nm, for example, where x1 denotes a ratio of Al in the AlGaN composition satisfying $0.80<=x1<=0.95$. The buffer layer 104 is an $Al_{x2}Ga_{1-x2}N$ layer having a thickness in a range of 25 nm to 75 nm, for example, where x2 denotes a ratio of Al in the AlGaN composition satisfying $0.20<=x2<=0.40$. The channel layer 105 is a GaN layer having a thickness of 50 nm or less, for example. The barrier layer 106 is an $Al_{x3}Ga_{1-x3}N$ layer having a thickness in a range of 4 nm to 20 nm, for example, where x3 denotes a ratio of Al in the AlGaN composition satisfying $0.50<=x3<=1.00$. The thickness of the channel layer 105 is preferably 50 nm or less, and more preferably 20 nm or less, in order to obtain an excellent quantum confinement effect. For example, the buffer layer 103 is lattice matched to the buffer layer 102, the buffer layer 104 is lattice matched to the buffer layer 103, and the channel layer 105 is lattice matched to the buffer layer 104. The barrier layer 106 may be lattice matched to the channel layer 105. The Miller indices of the upper surfaces of the buffer layers 102 through 104, the channel layer 105, and barrier layer 106 are also (0001).

The buffer layer 103 is subjected to compressive stress from the buffer layer 102 in an in-plane direction that is perpendicular to the thickness direction of the substrate 101 and the buffer layer 102. The buffer layer 104 is subjected to compressive stress from the buffer layer 103 in the same in-plane direction described above. The channel layer 105 is subjected to compressive stress from the buffer layer 104 in the same in-plane direction described above. The barrier layer 106 may be subjected to tensile stress from the channel layer 105 in the same in-plane direction described above.

The buffer layer 102 is an example of an underlayer, and the AlN of the buffer layer 102 is an example of a first nitride semiconductor. The underlayer may include the substrate 101. The buffer layer 103 is an example of a first buffer layer, and the $Al_{x1}Ga_{1-x1}N$ ($0.80<=x1<=0.95$) of the buffer layer 103 is an example of a second nitride semiconductor. The buffer layer 104 is an example of a second buffer layer, and the $Al_{x2}Ga_{1-x2}N$ ($0.20<=x2<=0.40$) of the buffer layer 104 is an example of a third nitride semiconductor. The GaN of the channel layer 105 is an example of a fourth nitride semiconductor. The $Al_{x3}Ga_{1-x3}N$ ($0.50<=x3<=1.00$) of the barrier layer 106 is an example of a fifth nitride semiconductor.

A device isolation region, which defines a device region, is formed in the nitride semiconductor laminated structure 130. In the device region, an opening 111s for a source, and an opening 111d for a drain, are formed in the barrier layer 106. A source electrode 1s is formed in the opening 111s, and a drain electrode 1d is formed in the opening 111d. The source electrode 1s and the drain electrode 1d make ohmic contact with the nitride semiconductor laminated structure 130. A passivation film 110, which covers the source electrode 1s and the drain electrode 1d, is formed on the barrier layer 106. An opening 112 is formed in the passivation film 110 at a position between the source electrode 1s and the drain electrode 1d in a plan view. A gate electrode 1g, which makes contact with the barrier layer 106 via the opening 112, is formed on the passivation film 110.

The source electrode 1s and the drain electrode 1d respectively include a Ta film having a thickness in a range of 10 nm to 50 nm, and an Al film formed on the Ta film and having a thickness in a range of 100 nm to 500 nm, for example. The gate electrode 1g includes a Ni film having a thickness in a range of 10 nm to 50 nm, and an Au film formed on the Ni film and having a thickness in a range of 300 nm to 500 nm, for example. The gate electrode 1g makes a Schottky contact with the nitride semiconductor laminated structure 130. The passivation film 110 is a film of an oxide, a nitride, or an oxynitride of Si, Al, Hf, Zr, Ti, Ta, or W, for example, and is preferably a Si nitride (SiN) film. The passivation film 110 has a thickness in a range of 2 nm to 500 nm, for example, and is preferably approximately 100 nm.

In the semiconductor device 100 according to the first embodiment, the buffer layer 102, the buffer layer 103, the buffer layer 104, the channel layer 105, and the barrier layer 106 have a band structure similar to the band structure of the buffer layer 902, the buffer layer 903, the buffer layer 904, the channel layer 905, and the barrier layer 906 of the fourth reference example illustrated in FIG. 8. Accordingly, the two-dimensional electron gas (2DEG) with a high concentration is present near the interface of the channel layer 105 with respect to the barrier layer 106, and no holes are present near the interface of the channel layer 105 with respect to the buffer layer 104. For this reason, it is possible to reduce the sheet resistance and the leak current.

Next, a method for manufacturing the semiconductor device 100 according to the first embodiment will be described. FIG. 10A through FIG. 11B are cross sectional views illustrating the method for manufacturing the semiconductor device 100 according to the first embodiment.

Figure 10A:
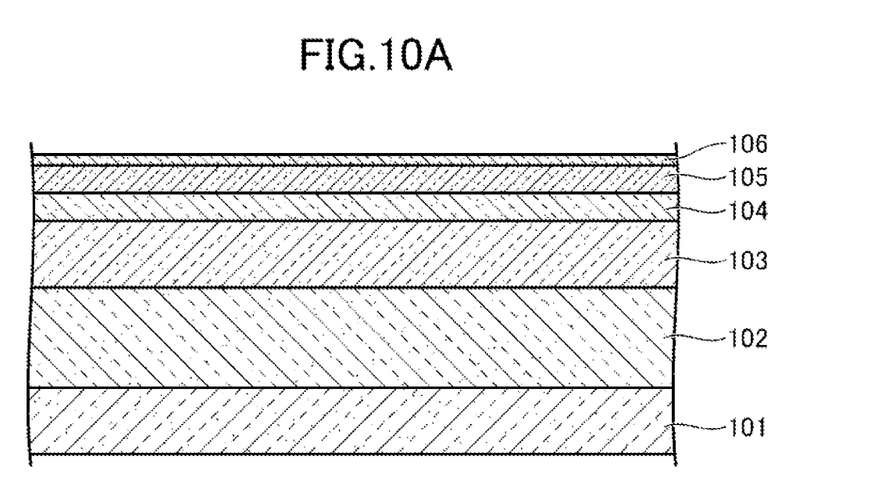
FIG. 10A and FIG. 10B are cross sectional views (part 1) illustrating a method for manufacturing the semiconductor device according to the first embodiment.

First, as illustrated in FIG. 10A, the nitride semiconductor laminated structure 130 is formed on a (0001) face of the substrate 101. When forming the nitride semiconductor laminated structure 130, the buffer layer 102, the buffer layer 103, the buffer layer 104, the channel layer 105, and the barrier layer 106 are formed by metal organic vapor phase epitaxy (MOVPE), for example. When forming the nitride semiconductor laminated structure 130, a mixed gas (or gas mixture) of trimethylaluminum (TMAl) gas, which is an Al source, trimethylgallium (TMGa) gas, which is a Ga source, and ammonia ($NH_3$) gas, which is a N source, for example, is used as a source gas. A hydrogen ($H_2$) gas or a nitrogen ($N_2$) gas is used as a carrier gas. The presence (or absence) and the flow rate of each of the TMAl gas supply and the TMGa gas supply are set appropriately according to the composition of the nitride semiconductor layer to be deposited. For example, a deposition pressure is approximately 1 kPa to approximately 100 kPa, and a deposition temperature is approximately 700° C. to approximately 1500° C. When the nitride semiconductor layer includes In, trimethylindium (In) may be used as an In source. More particularly, the deposition temperature of the buffer layer 103 is preferably in a range of 700° C. to 950° C., in order to cause the lattice matching of the buffer layer 103 with respect to the buffer layer 102. In addition, the deposition temperature of the buffer layer 104 is preferably in a range of 700° C. to 950° C., in order to cause the lattice matching of the buffer layer 104 with respect to the buffer layer 103.

Next, the device isolation region, which defines the device region, is formed in the nitride semiconductor laminated structure 130. When forming the device isolation region, a photoresist pattern, which exposes a region where the device isolation region is to be formed by photolithography, is formed on the nitride semiconductor laminated structure 130, for example, and ion implantation of Ar or the like is performed using this pattern as a mask. A dry etching, using a chlorine-based gas, may be performed using this pattern as an etching mask.

Figure 10B:
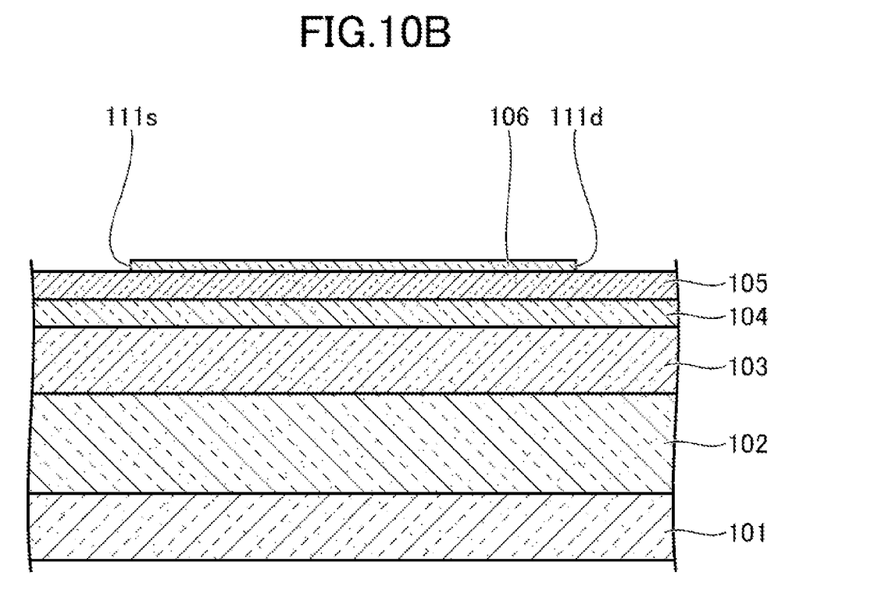

Thereafter, as illustrated in FIG. 10B, the opening 111s for the source, and the opening 111d for the drain, are formed in the barrier layer 106. When forming the opening 111s and the opening 111d, a photoresist pattern, which exposes regions where the opening 111s and the opening 111d are to be formed by photolithography, is formed on the barrier layer 106, for example. A dry etching, using a fluorine-based gas or a chlorine-based gas, is performed using this pattern as an etching mask. As a result, the channel layer 105 is exposed at the opening 111s and the opening 111d.

Figure 11A:
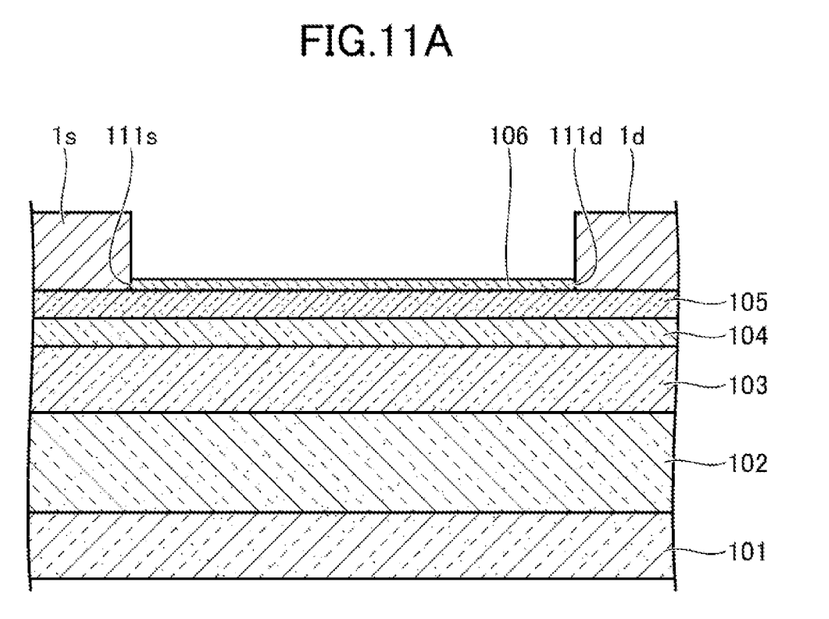
FIG. 11A and FIG. 11B are cross sectional views (part 2) illustrating the method of manufacturing the semiconductor device according to the first embodiment.

Next, as illustrated in FIG. 11A, the source electrode 1s is formed in the opening 111s, and the drain electrode 1d is formed in the opening 111d. The source electrode 1s and the drain electrode 1d may be formed by lift-off, for example. In other words, a photoresist pattern, which exposes regions where the source electrode 1s and the drain electrode 1d are to be formed, is formed, and a metal film is formed by deposition using this pattern as a deposition mask. Then, this pattern and the metal film thereon are removed. When forming the metal film, a Ta film is formed, and an Al film is formed on the Ta film, for example. Next, a heat treatment is performed in a nitrogen atmosphere at a temperature in a range of 400° C. to 1000° C., and preferably at approximately 550° C., for example, to establish ohmic properties.

Figure 11B:
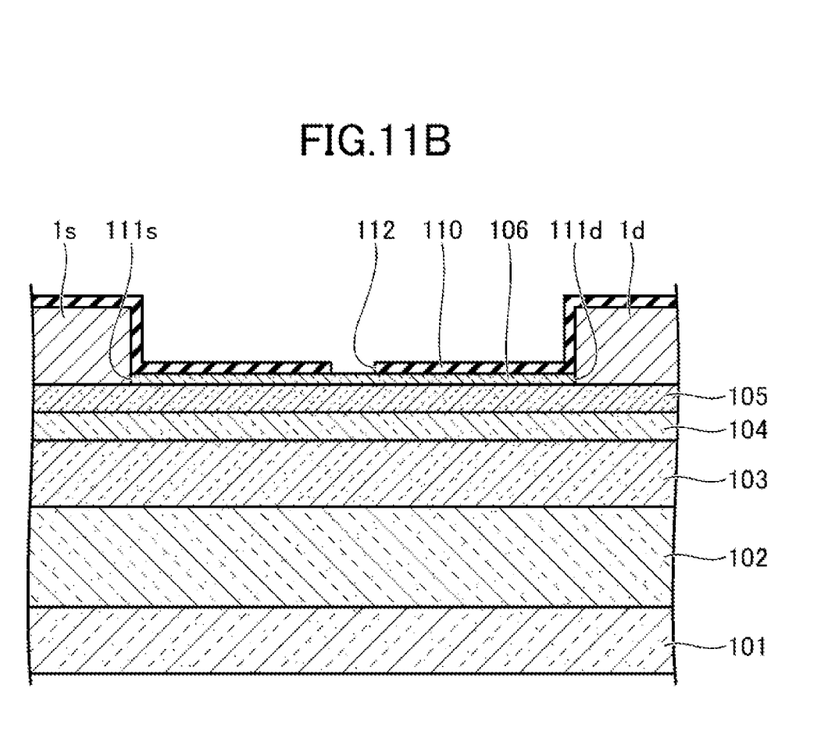

Next, as illustrated in FIG. 11B, the passivation film 110, which covers the source electrode 1s and the drain electrode 1d, is formed on the barrier layer 106. The passivation film 110 may be formed by plasma CVD, for example. The passivation film 110 may be formed by atomic layer deposition (ALD), or by sputtering. Then, the opening 112 is formed in the passivation film 110. When forming the opening 112, a photoresist pattern, which exposes a region where the opening 112 is to be formed by photolithography, is formed on the passivation film 110, for example. A dry etching, using a fluorine-based gas or a chlorine-based gas, is performed using this pattern as an etching mask. A wet etching using a hydrofluoric acid, a buffered hydrofluoric acid, or the like may be performed in place of the dry etching.

Thereafter, the gate electrode 1g, which makes contact with the barrier layer 106 via the opening 112, is formed on the passivation film 110 (refer to FIG. 9). The gate electrode 1g may be formed by lift-off, for example. In other words, the photoresist pattern, which exposes the region where the gate electrode 1g is to be formed, is formed, and a metal film is formed by deposition using this pattern as a deposition mask. Then, this pattern and the metal film thereon are removed. When forming the metal film, a Ni film is formed, and a AU film is formed on the Ni film, for example.

The semiconductor device 100 according to the first embodiment can be manufactured by the processes described above.

In a case where the buffer layer 102 (the underlayer) is an AlN layer, and the channel layer 105 is a GaN layer, the ratio x1 of Al in the composition of the AlGaN buffer layer 103 is preferably 0.80 or higher and 0.95 or lower, and the ratio x2 of Al in the composition of the AlGaN buffer layer 104 is preferably 0.20 or higher 0.40 or lower. If the ratio x1 of Al in the AlGaN composition is lower than 0.80, it may be difficult to lattice-match the buffer layer 103 to the buffer layer 102. If the ratio x1 of Al in the AlGaN composition is higher than 0.95, it may be difficult to lattice-match the buffer layer 104 to the buffer layer 103. Moreover, if the ratio x2 of Al in the AlGaN composition is lower than 0.20, it may be difficult to lattice-match the buffer layer 104 to the buffer layer 103. If the ratio x2 of Al in the AlGaN composition is higher than 0.40, it may be difficult to lattice-match the channel layer 105 to the buffer layer 104. The material used for the buffer layers 103 and 104 is not limited to AlGaN, and if the stress relationship is appropriate, InAlGaN may be used for the buffer layers 103 and 104.

Second Embodiment

Figure 12:
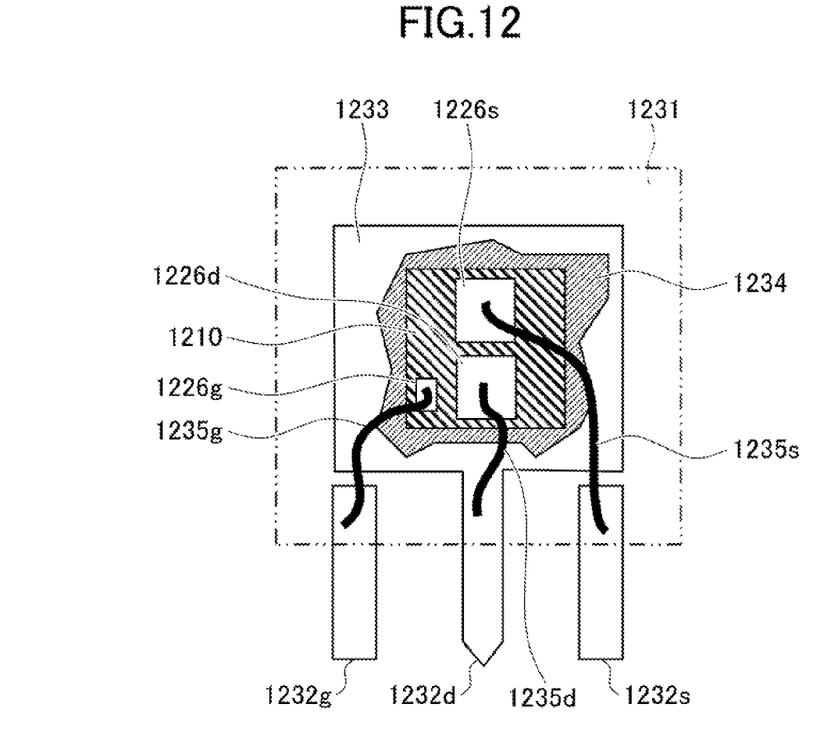
FIG. 12 is a diagram illustrating a discrete package according to a second embodiment.

Next, a second embodiment will be described. The second embodiment relates to a discrete package of the HEMT. FIG. 12 is a diagram illustrating the discrete package according to the second embodiment.

In the second embodiment, as illustrated in FIG. 12, a back surface of a semiconductor device 1210 having a structure similar to that of the first embodiment is fixed to a land (or die pad) 1233 using a die attach adhesive 1234, such as a solder or the like. One end of a wire 1235d, such as an Al wire or the like, is connected to a drain pad 1226d which is connected to the drain electrode 1d. The other end of the wire 1235d is connected to a drain lead 1232d which is integral with the land 1233. One end of a wire 1235s, such as an Al wire or the like, is connected to a source pad 1226s which is connected to the source electrode 1s. The other end of the wire 1235s is connected to a source lead 1232s which is independent of the land 1233. One end of a wire 1235g, such as an Al wire or the like, is connected to a gate pad 1226g which is connected to the gate electrode 1g. The other end of the wire 1235g is connected to a gate lead 1232g which is independent of the land 1233. The land 1233, the semiconductor device 1210, or the like are formed into a package by a mold resin 1231, so that a portion of the gate lead 1232g, a portion of the drain lead 1232d, and a portion of the source lead 1232s protrude from the package.

Such a discrete package may be manufactured in the following manner, for example. First, the semiconductor device 1210 is fixed to the land 1233 of a lead frame using the die attach adhesive 1234, such as the solder or the like. Next, the gate pad 1226g is connected to the gate lead 1232g of the lead frame, by bonding using the wires 1235g, 1235d and 1235s. The drain pad 1226d is connected to the drain lead 1232d of the lead frame, and the source pad 1226s is connected to the source lead 1232s of the lead frame. Thereafter, an encapsulation using the mold resin 1231 is performed by transfer molding. The lead frame is then disconnected from the package.

Third Embodiment

Figure 13:
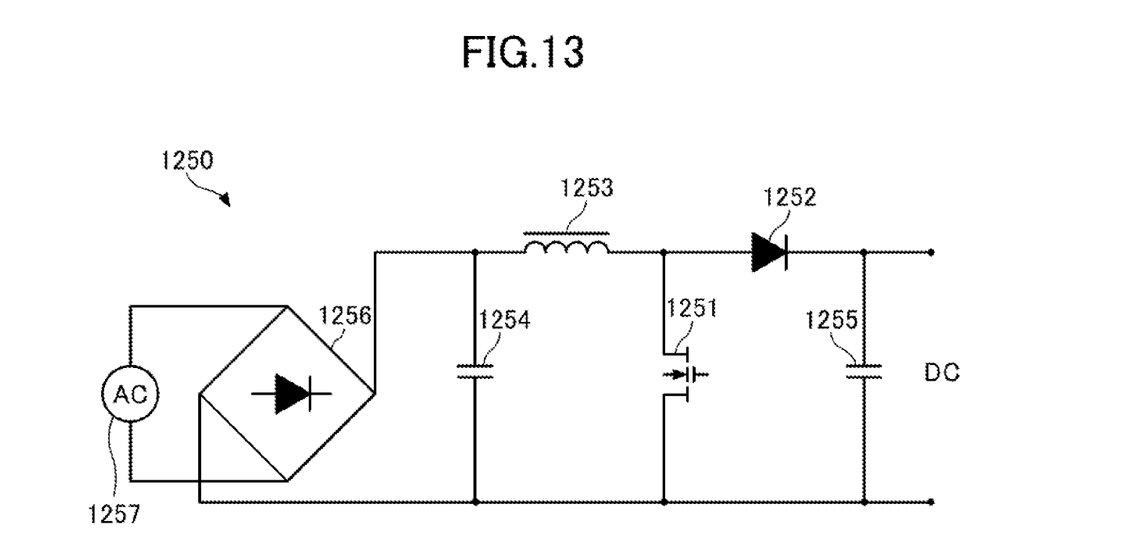
FIG. 13 is a circuit diagram illustrating a PFC circuit according to a third embodiment.

Next, a third embodiment will be described. The third embodiment relates to a power factor correction (PFC) circuit including the HEMT. FIG. 13 is a circuit diagram illustrating the PFC circuit according to the third embodiment.

A PFC circuit 1250 includes a switching device (transistor) 1251, a diode 1252, a choke coil 1253, capacitors 1254 and 1255, a diode bridge 1256, and an AC power supply 1257. A drain electrode of the switching device 1251 is connected to an anode terminal of the diode 1252 and to one terminal of the choke coil 1253. A source electrode of the switching device 1251 is connected to one terminal of the capacitor 1254 and to one terminal of the capacitor 1255. The other terminal of the capacitor 1254 is connected to the other terminal of choke coil 1253. The other terminal of capacitor 1255 is connected to a cathode terminal of the diode 1252 are connected. In addition, a gate driver is connected to a gate electrode of the switching device 1251. The AC power supply 1257 is connected between the terminals of the capacitor 1254, via the diode bridge 1256. A DC power supply is connected between the terminals of capacitor 1255. In this embodiment, a semiconductor device having a structure similar to that of the first embodiment is used for the switching device 1251.

When manufacturing the PFC circuit 1250, the switching device 1251 is connected to the diode 1252, the choke coil 1253, or the like, using a solder or the like, for example.

Fourth Embodiment

Figure 14:
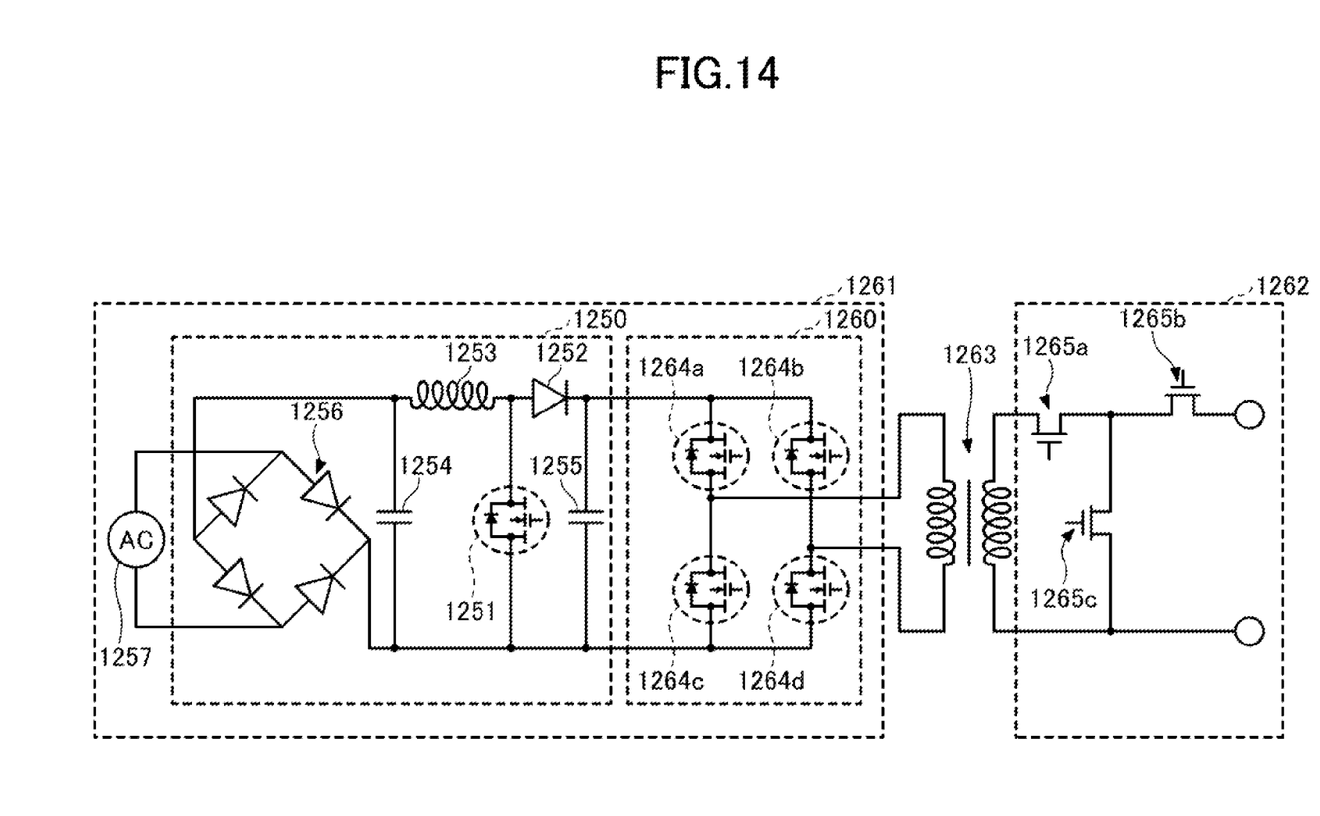
FIG. 14 is a circuit diagram illustrating a power supply according to a fourth embodiment.

Next, a fourth embodiment will be described. The fourth embodiment relates to a power supply including the HEMT, suitable for use as a server power supply. FIG. 14 is a circuit diagram illustrating a power supply according to the fourth embodiment.

The power supply includes a high-voltage primary circuit 1261, a low-voltage secondary circuit 1262, and a transformer 1263 arranged between the primary circuit 1261 and the secondary circuit 1262.

The primary circuit 1261 includes the PFC circuit 1250 according to the third embodiment, and an inverter circuit, such as a full bridge inverter circuit 1260, connected between the terminals of the capacitor 1255 of the PFC circuit 1250. The full bridge inverter circuit 1260 includes a plurality of (four in this example) switching devices 1264a, 1264b, 1264c, and 1264d.

The secondary circuit 1262 includes a plurality of (three in this example) switching devices 1265a, 1265b, and 1265c.

In this embodiment, a semiconductor device having a structure similar to that of the first embodiment is used for each of the switching device 1251 of the PFC circuit 1250, forming the primary circuit 1261, and the switching devices 1264a, 1264b, 1264c, and 1264d of the full bridge inverter circuit 1260. On the other hand, existing MIS type field effect transistors (FETs) using silicon are used for each of the switching devices 1265a, 1265b, and 1265c of the secondary circuit 1262.

Fifth Embodiment

Figure 15:
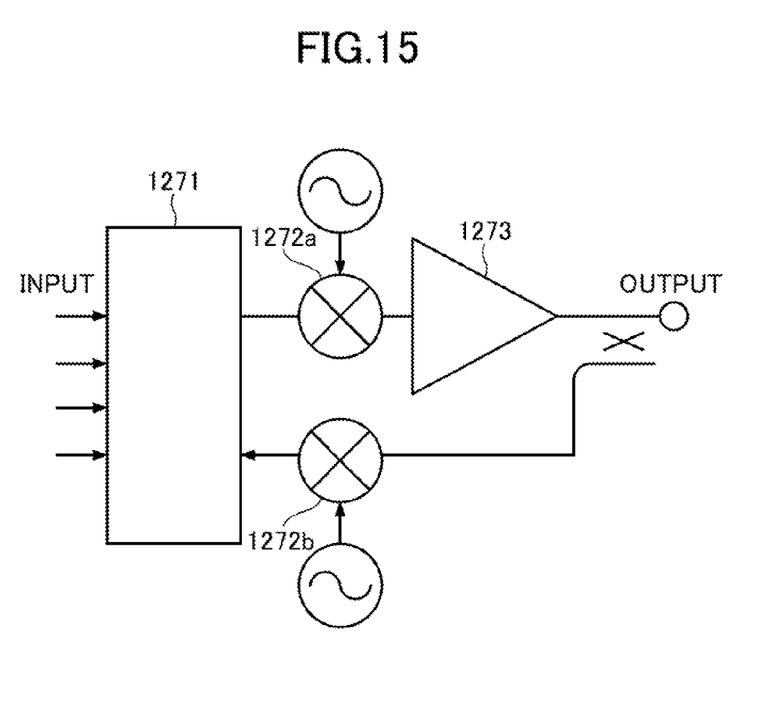
FIG. 15 is a circuit diagram illustrating an amplifier according to a fifth embodiment.

Next, a fifth embodiment will be described. The fifth embodiment relates to an amplifier including the HEMT. FIG. 15 is a circuit diagram illustrating the amplifier according to the fifth embodiment.

The amplifier includes a digital predistortion circuit 1271, mixers 1272a and 1272b, and a power amplifier 1273.

The digital predistortion circuit 1271 compensates for a nonlinear distortion of an input signal. The mixer 1272a mixes input signal, compensated of the non-linear distortion, and an AC signals, into a mixed signal. The power amplifier 1273 includes a semiconductor device having a structure similar to that of the first embodiment, and is configured to amplify the AC signal and the mixed input signal. In this embodiment, an output signal can be mixed with the AC signal by the mixer 1272b, and a mixed signal can be transmitted to the digital predistortion circuit 1271, by the switching of switching devices, for example. The amplifier may be used as a high-frequency amplifier or a high-power amplifier. The high-frequency amplifier may be used in transmitters and receivers for cellular base stations, radar devices, and microwave generators, for example.

In the present disclosure, silicon carbide (SiC) substrates, sapphire substrates, silicon (Si) substrates, AlN substrates, GaN substrates, or diamond substrates may be used for the substrate. The substrate may be electrically conductive, or semi-insulating, or insulating. If an electron transit layer can be formed on the substrate, the substrate may be used as the underlayer.

The structures of the gate electrode, the source electrode, and the drain electrode are not limited to those of the embodiments described above. For example, these electrodes may be formed of a single layer. In addition, the method of forming these electrode 1s not limited to the lift off. Further, if ohmic properties can be obtained, the heat treatment after forming the source electrode and the drain electrode may be omitted. The heat treatment may be performed after forming the gate electrode.

The Schottky type gate structure is used for the gate electrode in the embodiments described above, however, a metal-insulator-semiconductor (MIS) type gate structure may be used for the gate electrode.

According to each of the embodiments described above, it is possible to reduce the sheet resistance.

Although the embodiments are numbered with, for example, "first," "second," "third," "fourth," or "fifth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
an underlayer made of AlN;
a first buffer layer made of a composition represented by $Al_{x1}Ga_{1-x1}N$, where x1 denotes a ratio of Al in the $Al_{x1}Ga_{1-x1}N$ composition satisfying $0.80<=x1<=0.95$, and having a thickness in a range of 5 nm to 20 nm, provided on the underlayer, and subjected to compressive stress from the underlayer in an in-plane direction which is perpendicular to a thickness direction of the underlayer;
a second buffer layer disposed directly on the first buffer layer, the second buffer layer made of a composition represented by $Al_{x2}Ga_{1-x2}N$, where x2 denotes a ratio of Al in the $Al_{x2}Ga_{1-x2}N$ composition satisfying $0.20<=x2<=0.40$, and having a thickness in a range of 25 nm to 75 nm, and subjected to compressive stress from the first buffer layer in the in-plane direction;
a channel layer made of GaN and having a thickness greater than 0 nm and less than or equal to 50 nm, provided on the second buffer layer, and subjected to compressive stress from the second buffer layer in the in-plane direction; and
a barrier layer made of a nitride semiconductor, and provided above the channel layer.

2. The semiconductor device as claimed in claim 1, wherein
the first buffer layer is lattice matched to the underlayer,
the second buffer layer is lattice matched to the first buffer layer, and
the channel layer is lattice matched to the second buffer layer.

3. The semiconductor device as claimed in claim 2, wherein the barrier layer is lattice matched to the channel layer.

4. The semiconductor device as claimed in claim 1, wherein the channel layer has a thickness less than or equal to 20 nm.

5. The semiconductor device as claimed in claim 1, wherein a surface of the underlayer is a (0001) face.

6. An amplifier comprising the semiconductor device according to claim 1.

7. A power supply comprising the semiconductor device according to claim 1.

8. The semiconductor device as claimed in claim 1, wherein the barrier layer is made of a composition represented by $Al_{x3}Ga_{1-x3}N$, where x3 denotes a ratio of Al in the $Al_{x3}Ga_{1-x3}N$ composition satisfying $0.50<=x3<=1.00$, and having a thickness in a range of 4 nm to 20 nm.

* * * * *